United States Patent
Shinozaki et al.

(10) Patent No.: US 7,301,357 B2
(45) Date of Patent: Nov. 27, 2007

(54) INSPECTION METHOD AND INSPECTION EQUIPMENT

(75) Inventors: Dai Shinozaki, Nirasaki (JP); Shigekazu Komatsu, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/538,785

(22) PCT Filed: Dec. 9, 2003

(86) PCT No.: PCT/JP03/15722

§ 371 (c)(1),
(2), (4) Date: Jun. 10, 2005

(87) PCT Pub. No.: WO2004/053508

PCT Pub. Date: Jun. 24, 2004

(65) Prior Publication Data

US 2006/0061374 A1    Mar. 23, 2006

(30) Foreign Application Priority Data

Dec. 12, 2002 (JP) ............................. 2002-360148

(51) Int. Cl.
*G01R 31/02* (2006.01)

(52) U.S. Cl. ..................... 324/757; 324/754; 324/765

(58) Field of Classification Search ........ 324/754–762, 324/765

See application file for complete search history.

(56) References Cited

U.S. PATENT DOCUMENTS

| | | | | |
|---|---|---|---|---|
| 5,057,772 A * | 10/1991 | Bruno et al. | ................ | 324/754 |
| 5,070,297 A * | 12/1991 | Kwon et al. | ................ | 324/754 |
| 6,462,572 B2 * | 10/2002 | Takahashi | ................ | 324/755 |
| 6,529,011 B1 * | 3/2003 | Okubo | ................ | 324/537 |
| 6,777,967 B2 * | 8/2004 | Iino et al. | ................ | 324/757 |
| 6,788,090 B2 * | 9/2004 | Aihara | ................ | 324/765 |
| 6,897,666 B2 * | 5/2005 | Swettlen et al. | ............ | 324/754 |

FOREIGN PATENT DOCUMENTS

| | | |
|---|---|---|
| EP | 1 182 460 A2 | 2/2002 |
| JP | 10-010200 | 1/1998 |

* cited by examiner

*Primary Examiner*—Vinh Nguyen
*Assistant Examiner*—Arleen M. Vazquez
(74) *Attorney, Agent, or Firm*—Finnegan, Henderson, Farabow, Garrett & Dunner, L.L.P.

(57) ABSTRACT

In an inspection method according to the invention, a plurality of drivers 21 incorporated in a tester 20 apply a fritting voltage to respective electrodes P via first probe pins 11A included in pairs of first and second probe pins 11A and 11B and connected to the respective drivers.

10 Claims, 1 Drawing Sheet

INSPECTION METHOD AND INSPECTION EQUIPMENT

This application is based upon and claims the benefit of priority from prior Japanese Patent Application No. 2002-360148, filed Dec. 12, 2002, the entire contents of which are incorporated herein by reference.

This patent application is a U.S. national phase application under 35 U.S.C 371 of International Application PCT/JP2003/015722 (not published in English), filed on Dec. 9, 2003, the contents of which are incorporated herein by reference.

TECHNICAL FIELD

The present invention relates to an inspection method and inspection apparatus for inspecting to-be-inspected samples, in which probe pins are electrically connected to inspection electrodes by a fritting phenomenon.

BACKGROUND ART

A semiconductor treatment process comprises various steps, such as a step of inspecting the electrical characteristic of a to-be-inspected object (e.g., a semiconductor device) in the state of a wafer, and a step of inspecting a to-be-inspected object in the state of a package. To perform inspection, the electrodes of a wafer are brought into contact with contact elements (e.g., probe pins). A measurement signal is applied to the electrodes via the probe pins. The surfaces of the electrodes of the to-be-inspected object are coated with electrically insulating oxide films. Accordingly, in the prior art, each probe pin is pressed against an electrode, thereby removing part of the oxide film of the electrode and electrically connecting them to each other.

However, in a high-density device formed on a wafer, electrodes and wires formed of thin films are employed. The method for removing the oxide film of each electrode P using corresponding probe pins during inspection of a wafer may well damage each electrode or its ground layer. To prevent such damage, a method for removing the oxide film of each electrode utilizing the fritting phenomenon has been proposed (see patent document 1—Jan. Pat. Appln. KOKAI Publication No. 2002-139542 (claim 1 and section [0046])).

Referring to, for instance, FIG. 2, the technique described in patent document 1 will be roughly described. As shown in FIG. 2, a probe card 1 comprises pairs of probe pins 2 to be brought into contact with respective electrodes P on a wafer, and relays 3 connected to the respective pairs of probe pins 2. The relays 3 switch the connection destination of each pair of probe pins 2 from a tester 4 to a power supply 5 for fritting or vice versa. To inspect the electrical characteristic of the to-be-inspected object on the wafer, firstly, a pair of probe pins 2 is brought into contact with an electrode P. The corresponding relay 3 connects the pair of probe pins 2 to the power supply 5 for fritting. The fritting power supply 5 applies a voltage to one of the pair of probe pins 2, and gradually increases the voltage level. At this time, the fritting phenomenon occurs, thereby breaking the oxide film between the tips of the pair of probe pins 2 to electrically connect the probe pins 2. The relay 3 switches the connection destination of the pair of probe pins 2 from the fritting power supply 5 to the tester 4. The tester 4 applies an inspection signal to the electrode P via one of the probe pins 2 to thereby test the electrical characteristic of the to-be-inspected object. The use of the fritting phenomenon enables the probe pressure between each probe pin 2 and the electrode P to be set extremely low, with the result that the electrodes, for example, are prevented from being damaged, and a highly reliable inspection can be executed. The fritting phenomenon is such a phenomenon as this. When a voltage is applied to an oxide film formed on the surface of a metal (an electrode in the invention), and the potential inclination applied is increased to about 105 to 106V/cm, a current flows to break the oxide film because of non-uniformity in the thickness of the oxide film and the composition of the metal.

DISCLOSURE OF INVENTION

However, in the inspection method and apparatus described in patent document 1, the fritting phenomenon is utilized in units of probe pins 2 connected to a signal line for testing by the tester 4. Since the fritting phenomenon is utilized a large number of times for probe inspection, much time is required, and the throughput of the inspection is reduced. In the case of the disclosed inspection apparatus, the power supply 5 dedicated to fritting and the relay 3 are needed. The relay 3 must be provided on the probe card 1. In accordance with the development of high integration in a semiconductor device, the number of required probe pins 2 is increased, and hence the number of required relays 3 is increased. However, the number of relays 3 that can be mounted on the probe card 1 is limited.

The present invention aims to overcome at least one of the above problems.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

In accordance with a first aspect of the invention, there is provided a method of inspecting an electrical characteristic of a to-be-inspected object, comprising: bringing pairs of probe pins into contact with respective electrodes of at least one to-be-inspected object; applying a voltage to the respective inspection electrodes via the pairs of probe pins by power supplies connected to the respective pairs of probe pins, thereby causing the fritting phenomenon to occur between tips of each pair included in the pairs of probe pins; and applying an inspection signal to the electrodes of the to-be-inspected object via the pairs of probe pins, thereby inspecting an electrical characteristic of the to-be-inspected object.

It is preferable that the above method includes at least one of the following features (a) to (c):

(a) The inspection of the electrical characteristic of the to-be-inspected object is performed by a tester circuit, the tester circuit transmitting the inspection signal via respective electrical connection lines connecting the tester circuit to the respective probe pins included in the pairs of probe pins; and The power supplies are formed of respective drivers provided in the tester circuit, respective drivers applying a voltage to the respective electrodes via the electrical connection lines and the respective pairs of probe pins.

(b) The application of voltage by the power supplies which is connected to the respective pairs of probe pins to the respective electrodes via the respective pairs of probe pins includes one process included in a of simultaneously applying the voltage to the electrodes, and a process of sequentially applying the voltage to the electrodes.

(c) When the voltage applied by the power supplies to the respective electrodes reaches a predetermined limit value, when a current resulting from the voltage reaches a predetermined limit value, when the voltage shows a predetermined change, or when the current shows a predetermined change, application of the voltage to the electrodes is stopped.

In accordance with a second aspect of the invention, there is provided an apparatus for inspecting an electrical characteristic of a to-be-inspected object, comprising:

pairs of probe pins to be brought into contact with respective electrodes of at least one to-be-inspected object;

power supplies connected to the respective pairs of probe pins to apply a voltage to the respective electrodes, a fritting phenomenon occurring between tips of each pair included in the pairs of probe pins, as a result of application of the voltage; and a tester which transmits, after the fritting phenomenon occurs, an inspection signal to the electrodes of the to-be-inspected object, thereby inspecting an electrical characteristic of the to-be-inspected object.

It is preferable that the above apparatus further comprises at least one of the following features (d) to (f):

(d) The apparatus further comprises:

a tester which transmits an inspection signal to the electrodes of the to-be-inspected object, thereby inspecting the electrical characteristic of the to-be-inspected object;

pairs of probe pins to be brought into contact with the respective electrodes;

electrical connection lines connecting the tester to the respective pairs of probe pins; and a plurality of drivers provided in the tester circuit, the drivers being connected to the respective pairs of probe pins to apply a voltage to the respective electrodes, the electrical connection lines transmitting the inspection signal from the tester and the voltage from the drivers to the respective electrodes of the to-be-inspected object.

(e) The apparatus further comprises switch mechanisms provided between the respective drivers and the respective pairs of probe pins, the switch mechanisms being voltages witching mechanisms which enable one process included in a process of simultaneously applying the voltage to the electrodes, and a process of sequentially applying the voltage to the electrodes.

(f) The apparatus further comprises comparators connected between the respective drivers and the respective pairs of probe pins, the comparators detecting whether the voltage applied by the power supplies to the respective electrodes reaches a predetermined limit value, and wherein when the comparators detect whether one of the voltage and the current reaches the predetermined limit value, the switch mechanisms stop application of the voltage to the probe pins by the drivers.

BEST MODE FOR CARRYING OUT THE INVENTION

Figure 1:
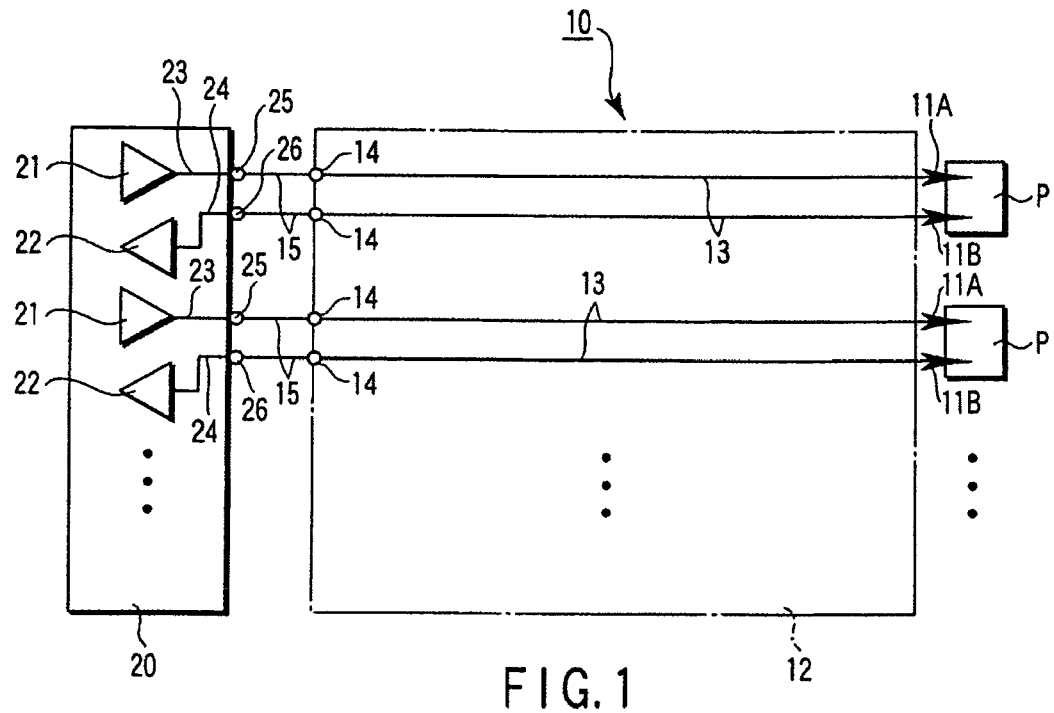
FIG. 1 is a block diagram illustrating an essential part of an inspection apparatus according to an embodiment of the invention.
Figure 2:
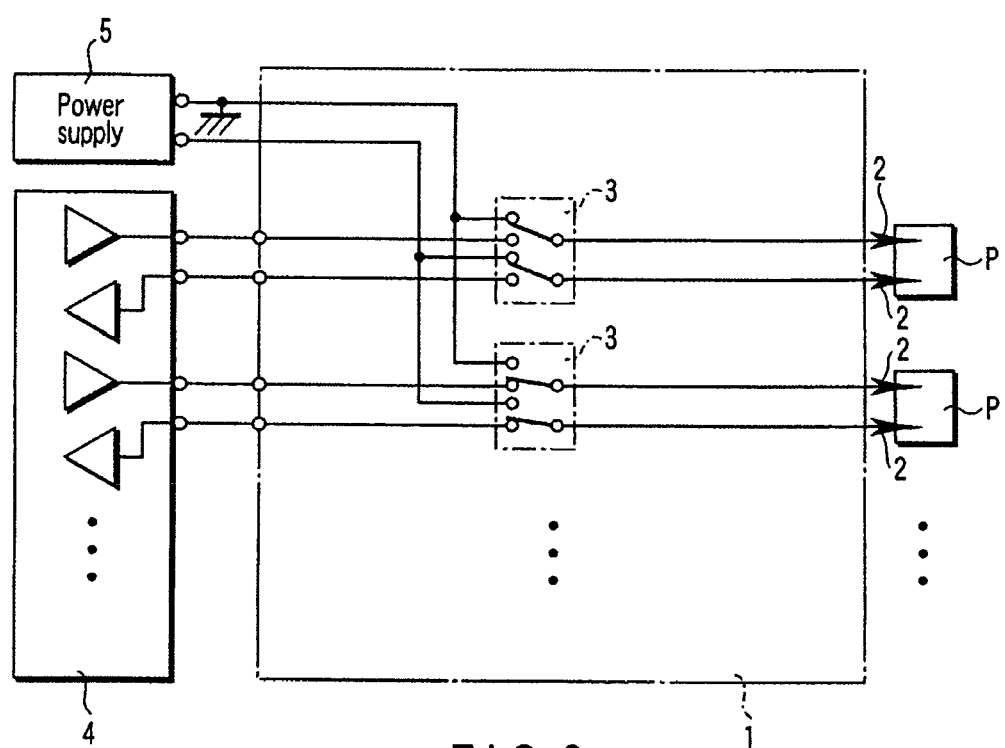
FIG. 2 is a block diagram illustrating an example of an inspection apparatus according to the prior art.

The invention will be described using the embodiment shown in FIG. 1. An inspection apparatus 10 according to the embodiment comprises a probe card 12, and the probe card 12 has a plurality of electrodes P on a wafer, pairs of first and second probe pins 11A and 11B to be brought into contact with the respective electrodes P. The probe card also has electrical connection lines 13 (e.g., connection lines dedicated to fritting, or connection wires also serving as signal lines) 13 connected to the first and second probe pins 11A and 11B, terminals 14 of the signal lines 13, and relay terminals (e.g., pogo pins) 15 electrically disconnectably contacting the respective terminals 14. The first and second probe pins 11A and 11B are connected to a tester 20 via the relay terminals 15. The probe card 12 can be secured to, for example, a head plate (not shown) in a probe chamber incorporated in the inspection apparatus 10. The probe card 12 can be brought into electrical contact with a tester head (not shown), incorporated in the tester 20, via an insert ring (not shown) contained in each relay terminal 25.

Although not shown, the inspection apparatus 10 of the embodiment can incorporate, as in the prior art, a mounting table for mounting a wafer thereon, movable in the X, Y and Z directions and θ direction, and an alignment mechanism cooperating with the mounting table to align a wafer with the probe pins 11A and 11B.

The first and second probe pins 11A and 11B are connected to a power supply 21 for applying a voltage thereto for fritting. As shown in FIG. 1, the tester 20 can incorporate drivers 21 and comparators 22 corresponding to the respective pairs of first and second probe pins 11A and 11B. The drivers 21 are detachably connected to the respective first probe pins 11A, while the comparators 22 are detachably connected to the respective second probe pins 11B. The drivers 21 and comparators 22 are connected to the signal lines 23 and 24, respectively. These lines are electrically connected to the first and second probe pins 11A and 11B via terminals 25 and 26, respectively, and can be disconnected therefrom. Further, the drivers 21 can apply, to the respective first probe pins 11A, a voltage necessary for generating the fritting phenomenon.

Where the first and second probe pins 11A and 11B are in contact with the electrode P under a very low probe pressure (e.g., 1 mN or less), the driver 21 incorporated in the tester 20 applies a voltage for fritting to the electrode P via the relay terminal 15, signal line 13 and first probe pin 11A of the inspection apparatus 10, and gradually increases the voltage. Firstly, a very small amount of current flows between the tips of the first and second probe pins 11A and 11B via the oxide film of the electrode P. After that, the current flowing through the oxide film while breaking it is abruptly increased. This current flows from the second probe pin 11B of the inspection apparatus 10 to the comparator 22 via the signal line 13, the relay terminal 15 and the signal line 24 of the tester 20. When the comparator 22 detects a limit voltage value (or limit current value), the application of the voltage from the driver to the probe pin is stopped. After the fritting phenomenon occurs, the first and second probe pins 11A and 11B are used as probe pins for inspection, being kept in contact with the electrode.

A description will be given of an inspection method using the above-described inspection apparatus 10, according to an embodiment of the invention. A wafer is placed on the mounting table in the inspection apparatus 10. By operating the alignment mechanism and moving the mount table in the X, Y and Z directions and θ direction, the electrodes P of the to-be-inspected object on the mounting table are aligned with the first and second probe pins 11A and 11B. The mounting table is raised to bring each electrode P of the wafer into contact with the corresponding first and second probe pins 11A and 11B under a low probe pressure of, for example, 1 mN or less.

The drivers 21 apply a voltage for fritting to the respective electrodes P via the respective relay terminals 15 of the inspection apparatus 10 and the respective signal lines 13 and first probe pins 11A of the probe card 12. The voltage may be simultaneously applied to the electrodes, or sequentially applied thereto. On each electrode P, firstly, a small amount of current flows between the first and second probe pins 11A and 11B. When the voltage for fritting is gradually increased, the fritting phenomenon occurs and the current flowing between the first and second probe pins 11A and 11B is abruptly increased, thereby breaking the oxide film of each electrode P. As a result, the tips of the first and second probe pins 11A and 11B on each electrode P are electrically connected, and the comparators 22 stop the application of the voltage from the drivers 21 to the electrodes.

When the drivers simultaneously apply the voltage to the probe pins, the tips of all first and second probe pins 11A and 11B can be electrically connected by one-time application of the fritting voltage. Compared to the prior art in which a fritting voltage is applied in units of signal lines, the time required for fritting can be significantly reduced.

Thereafter, the drivers 21 transmit respective inspection signals via the respective signal lines 23, thereby inspecting the electrical characteristic of the to-be-inspected object as in the prior art. Since this inspection can be performed under an extremely low probe pressure, the first and second probe pins 11A and 11B and the electrodes P, etc., can be spared damage, and hence a highly reliable inspection can be executed.

As described above, in the embodiment, each power supply connected to the corresponding pair of probe pins can apply a voltage to each of the corresponding probe pins.

When each driver of the tester circuit uses the corresponding power supply, no new power supply is necessary. The number of lines required for the inspection apparatus can be reduced by using the inspection signal lines also as electrical connection lines for applying a voltage from the drivers to the probe pins.

By simultaneously applying a fritting voltage from the power supplies to the respective electrodes, the time required for fritting can be significantly reduced, which significantly enhances the throughput of inspection.

When the voltage applied by each power supply to the corresponding electrode is detected to reach a limit value, when the current flowing through each pair of probe pins is detected to reach a predetermined value, or when the voltage or current is detected to show a predetermined change, the application of the fritting voltage to the electrode is stopped to spare the electrode and probe pins damage.

The above-mentioned limit value for the voltage, the predetermined value for the current, and the predetermined change for the voltage or current depend upon the surface state of the electrode. The limit value for the voltage and the predetermined value of the current can be set to, for example, 600 mV or less, 600 mA or more, respectively.

As an example of the predetermined change for the voltage, a change from the initial voltage (e.g., 5-10V) to a low voltage (e.g., 600 mV or less) can be employed. As an example of the predetermined change for the current, a change from the initial slight current to a relatively high current (e.g., 600 mA or more), at which the probe and electrode are electrically connected, can be employed.

In the embodiment, when the drivers of the tester 20 are used as fritting power supplies, no particular power supply dedicated to fritting or relay is needed, which reduces the manufacturing cost. Since the relays on the probe card 12 can be omitted, the area for mounting can be increased by the area corresponding to the relay-mounting area, which enables the apparatus to deal with highly density semiconductor devices. Since the second probe pins 11B of the tester 20 are connected to the respective comparators 22, the limit voltage or limit current during fritting can be detected through the comparators 22.

The invention is not limited to the above-described embodiment, but each structural element can be modified when necessary.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of inspecting an electrical characteristic of a to-be-inspected object, comprising:
   bringing pairs of probe pins into contact with respective electrodes of at least one to-be-inspected object;
   simultaneously applying a voltage to the respective inspection electrodes via the pairs of probe pins by drivers of a tester, the driver being connected to the respective pairs of probe pins, thereby causing a fritting phenomenon, in which a predetermined potential inclination is formed and a current flows to break an oxide film, to occur between tips of each pair included in the pairs of probe pins; and
   applying an inspection signal from the drivers to the electrodes of the to-be-inspected object via the respective pairs of probe pins, thereby inspecting an electrical characteristic of the to-be-inspected object by a tester,
   wherein the fritting voltage and the inspection signal are applied via identical signal lines between the drivers of the tester circuit and said first probe pins.

2. The method according to claim 1, wherein:
   the driver transmits the inspection signal via respective electrical connection lines connecting the driver to the respective probe pins included in the pairs of probe pins; and
   respective drivers apply a voltage, which causes a fritting phenomenon, to the respective electrodes via the electrical connection lines and the respective pairs of probe pins.

3. The method according to claim 2, wherein the applying the voltage by the drivers which are connected to the respective pairs of probe pins to the respective electrodes via the electrical connection lines and the respective pairs of probe pins includes sequentially applying the voltage to the electrodes instead of simultaneously applying the voltage to the electrodes.

4. The method according to claim 2, wherein when the voltage applied by the drivers to the respective electrodes reaches a predetermined limit value, when a current resulting from the voltage reaches a predetermined limit value or when the current shows a predetermined change, application of the voltage to the electrodes by the drivers is stopped.

5. An apparatus for inspecting an electrical characteristic of a to-be-inspected object, comprising:
   pairs of probe pins to be brought into contact with respective electrodes of at least one to-be-inspected object;

drivers of a tester connected to the respective pairs of probe pins via signal lines to simultaneously apply a voltage to the respective electrodes, thereby causing a fritting phenomenon, in which a predetermined potential inclination is formed and a current flows to break an oxide film, occurring between tips of each pair included in the pairs of probe pins, as a result of application of the voltage; and a tester which transmits, after the fritting phenomenon occurs, an inspection signal to the electrodes of the to-be-inspected object via the signal lines and using the driver, thereby inspecting an electrical characteristic of the to-be-inspected object.

6. The apparatus according to claim 5, further comprising:

pairs of probe pins to be brought into contact with the respective electrodes;

electrical connection lines connecting the driver to the respective pairs of probe pins;

the drivers provided in the tester, circuit, the drivers being connected to the respective pairs of probe pins to apply the drivers applying a voltage, which causes a fritting phenomenon to the respective electrodes, and wherein the electrical connection lines transmit the inspection signal from the tester and the voltage from the drivers to the respective electrodes of the to-be-inspected object.

7. The apparatus according to claim 6, wherein the driver is provided in the tester, and has a function of sequentially applying a voltage to the respective electrodes in addition to simultaneously applying a voltage to the respective electrodes.

8. The apparatus according to claim 7, further comprising:

comparators connected between the respective drivers and the respective pairs of probe pins, the comparators detecting at least one of whether the voltage applied by the drivers to the respective electrodes reaches a predetermined limit value, whether a current resulting from the voltage reaches a predetermined limit value, and whether the current shows a predetermined change, and wherein when the comparators detect whether one of the voltage and a current reaches the predetermined limit value, the drivers stop application of the voltage to the probe pins.

9. A method of inspecting an electrical characteristic of a to-be-inspected object, comprising:

bringing pairs of probe pins into contact with respective electrodes of at least one to-be-inspected object;

sequentially applying a voltage to the respective inspection electrodes via the pairs of probe pins by drivers connected to the respective pairs of probe pins, thereby causing a fritting phenomenon, in which a predetermined potential inclination is formed and a current flows to break an oxide film, to occur between tips of each pair included in the pairs of probe pins; and applying an inspection signal by the respective drivers to the electrodes of the to-be-inspected object via the respective pairs of probe pins, thereby inspecting an electrical characteristic of the to-be-inspected object by a tester, wherein each driver transmits the inspection signal and the voltage via electrical connection lines connecting the driver to the respective probe pins included in the pairs of probe pins.

10. The method according to claim 9, wherein when the voltage applied by the drivers to the respective electrodes reaches a predetermined limit value, when a current resulting from the voltage reaches a predetermined limit value or when the current shows a predetermined change, application of the voltage to the electrodes by the drivers is stopped.

* * * * *

UNITED STATES PATENT AND TRADEMARK OFFICE
CERTIFICATE OF CORRECTION

PATENT NO. : 7,301,357 B2  
APPLICATION NO. : 10/538785  
DATED : November 27, 2007  
INVENTOR(S) : Dai Shinozaki et al.

It is certified that error appears in the above-identified patent and that said Letters Patent is hereby corrected as shown below:

In claim 6, column 7, lines 19-22, "tester, circuit, the drivers being connected to the respective pairs of probe pins to apply the drivers applying a voltage, which causes a fritting phenomenon to the respective electrodes," should read --tester, the drivers applying a voltage, which causes a fritting phenomenon, to the respective electrodes,--.

Page 1 of 1

Signed and Sealed this

Fifteenth Day of April, 2008

JON W. DUDAS  
*Director of the United States Patent and Trademark Office*